(12) United States Patent
Lim et al.

(10) Patent No.: US 11,774,665 B2
(45) Date of Patent: Oct. 3, 2023

(54) LIGHT SOURCE MODULE

(71) Applicant: LG INNOTEK CO., LTD., Seoul (KR)

(72) Inventors: Eay Jin Lim, Seoul (KR); Seong Jin Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/908,737

(22) PCT Filed: Mar. 11, 2021

(86) PCT No.: PCT/KR2021/003000
§ 371 (c)(1),
(2) Date: Sep. 1, 2022

(87) PCT Pub. No.: WO2021/182880
PCT Pub. Date: Sep. 16, 2021

(65) Prior Publication Data
US 2023/0120518 A1 Apr. 20, 2023

(30) Foreign Application Priority Data
Mar. 12, 2020 (KR) .................. 10-2020-0030723

(51) Int. Cl.
*F21V 8/00* (2006.01)
(52) U.S. Cl.
CPC ......... *G02B 6/0065* (2013.01); *G02B 6/0073* (2013.01)
(58) Field of Classification Search
CPC .................. G02B 6/0065; G02B 6/0073
See application file for complete search history.

(56) References Cited

U.S. PATENT DOCUMENTS

| 2004/0042233 | A1 | 3/2004 | Suzuki et al. | |
| 2009/0167990 | A1* | 7/2009 | Konno | G09G 3/3426 349/65 |
| 2009/0273947 | A1* | 11/2009 | Takada | G02B 6/0068 362/611 |
| 2011/0134623 | A1 | 6/2011 | Sherman et al. | |
| 2011/0235308 | A1* | 9/2011 | Kang | G02B 6/0078 362/97.1 |
| 2011/0292681 | A1 | 12/2011 | Kurihara | |
| 2014/0009930 | A1* | 1/2014 | Han | F21V 13/08 362/231 |

FOREIGN PATENT DOCUMENTS

| KR | 10-2014-0007209 | 1/2014 |
| WO | WO 2015-174728 | 11/2015 |

OTHER PUBLICATIONS

International Search Report dated Jun. 24, 2021 issued in Application No. PCT/KR2021/003000.

* cited by examiner

*Primary Examiner* — Mary Ellen Bowman
(74) *Attorney, Agent, or Firm* — KED & ASSOCIATES, LLP

(57) ABSTRACT

A light source module comprises: a printed circuit board; a light source disposed on the printed circuit board; a first light guide layer disposed on the printed circuit board, and accommodating the light source; and a second light guide layer disposed above the first light guide layer, wherein a material of the first light guide layer is different from that of the second light guide layer, and a refractive index of the first light guide layer is greater than that of the second light guide layer.

20 Claims, 6 Drawing Sheets

| Nit | 1 | 2 |
|---|---|---|
| Min [nit] | 6550 | 6477 |
| Max [nit] | 16595 | 15252 |
| Mean [nit] | 10347 | 10130 |
| Homogeneity | 39% | 42% |

(II)

| Nit | 1 | 2 |
|---|---|---|
| Min [nit] | 7063 | 7327 |
| Max [nit] | 15804 | 15903 |
| Mean [nit] | 10757 | 10515 |
| Homogeneity | 45% | 46% |

(III)

| Nit | 1 | 2 |
|---|---|---|
| Min [nit] | 7611 | 7973 |
| Max [nit] | 14547 | 14128 |
| Mean [nit] | 10827 | 10539 |
| Homogeneity | 52% | 56% |

| Nit | 1 | 2 |
|---|---|---|
| Min [nit] | 8118 | 8119 |
| Max [nit] | 16340 | 15758 |
| Mean [nit] | 11667 | 11043 |
| Homogeneity | 50% | 52% |

(II)

| Nit | 1 | 2 |
|---|---|---|
| Min [nit] | 8920 | 8920 |
| Max [nit] | 16450 | 14869 |
| Mean [nit] | 11982 | 11311 |
| Homogeneity | 54% | 60% |

(III)

| Nit | 1 | 2 |
|---|---|---|
| Min [nit] | 9024 | 9225 |
| Max [nit] | 15719 | 14518 |
| Mean [nit] | 11964 | 11232 |
| Homogeneity | 57% | 64% |

| Nit | 1 | 2 |
|---|---|---|
| Min [nit] | 8063 | 8031 |
| Max [nit] | 17051 | 15013 |
| Mean [nit] | 11329 | 10558 |
| Homogeneity | 47% | 53% |

(II)

| Nit | 1 | 2 |
|---|---|---|
| Min [nit] | 7844 | 7830 |
| Max [nit] | 15998 | 13860 |
| Mean [nit] | 11676 | 10824 |
| Homogeneity | 49% | 56% |

(III)

| Nit | 1 | 2 |
|---|---|---|
| Min [nit] | 8002 | 7999 |
| Max [nit] | 15961 | 13140 |
| Mean [nit] | 11787 | 10857 |
| Homogeneity | 50% | 61% |

LIGHT SOURCE MODULE

CROSS-REFERENCE TO RELATED PATENT APPLICATIONS

This application is a U.S. National Stage Application under 35 U.S.C. § 371 of PCT Application No. PCT/KR2021/003000, filed Mar. 11, 2021, which claims priority to Korean Patent Application No. 10-2020-0030723, filed Mar. 12, 2020, whose entire disclosures are hereby incorporated by reference.

TECHNICAL FIELD

The present embodiment relates to a light source module.

BACKGROUND ART

The content described below provides background information on the present embodiment and does not describe the prior art.

A light source module using various light sources used in electronic devices is implemented in a way to increase light efficiency by utilizing a suitable light source according to the characteristics of each electronic device.

Recently, the light source module used in such electronic devices can be variously applied to backlight units being applied to flat panel displays, or indoor lamps being used in an indoor environment, or headlamps, fog lamps, reversing lamps, side lamps, number lamps, tail lamps, brake lamps, direction indicator lamps, emergency flashing lights being installed outside the automobiles, and indoor lightings being installed inside the automobiles.

Meanwhile, efforts to improve the luminous efficiency of LEDs are continuously progressing from chips to packages. For example, in a packaging stage, a relatively high current is applied using a material having good heat dissipation efficiency using a heat sink to form a thermally stable structure, and efforts are being made to increase light extraction efficiency with an optimal design considering the optical structure and characteristics of the package.

However, although significant parts of such efforts have been achieving certain degrees of effects at the laboratory level, there are considerable difficulties in applying them to actual manufacturing processes.

DETAILED DESCRIPTION OF THE INVENTION

Technical Subject

The present embodiment is intended to provide a light source module having a high light efficiency by improving the structure and capable of removing a hot spot for a surface light source.

In addition, it is intended to provide a light source module in which a separate layer is implemented to remove the hot spots of the LED, the process is simplified by simplifying the structure in a structure where multiple processes are applied, and at the same time, a uniform surface light source is provided.

Technical Solution

As an embodiment, a light source module comprises: a printed circuit board; a light source being disposed on the printed circuit board; a first light guide layer being disposed on the printed circuit board, and accommodating the light source; and a second light guide layer being disposed at an upper portion of the first light guide layer, wherein the material of the first light guide layer is different from the material of the second light guide layer, and wherein the refractive index of the first light guide layer is greater than the refractive index of the second light guide layer. The material of the first light guide layer may include silicon, and the material of the second light guide layer may include barium sulfate and resin.

The composition ratio of the barium sulfate to the resin may be 1:4.

The thickness of the first light guide layer may be greater than the thickness of the second light guide layer.

The light source may be a side view type light emitting diode.

It may include a light reflective layer being disposed on the printed circuit board and reflecting the light irradiated from the light source.

The refractive index of the first light guide layer may be 1.5 to 1.6 or less, and the refractive index of the second light guide layer may be 1.4 to 1.5 or less.

The thickness of the first light guide layer may be 2 mm to 4 mm or less, and the thickness of the second light guide layer may be 0.4 mm to 1.0 mm or less.

Based on the thickness of the first light guide layer, the thickness of the second light guide layer may be 0.13 to 0.34 or less.

As another embodiment, a light source module comprises: a printed circuit board; a light source being disposed on the printed circuit board; a first light guide layer being disposed on the printed circuit board and accommodating the light source; and a second light guide layer being disposed at an upper portion of the first light guide layer,
wherein the material of the first light guide layer is different from the material of the second light guide layer, and wherein the thickness of the first light guide layer is greater than the thickness of the second light guide layer.

Advantageous Effects

According to the present invention, since light is irradiated to a first light guide layer and a second light guide layer having different refractive indices, there is an advantage in that the light uniformity is increased and hot spots can be removed.

BRIEF DESCRIPTION OF DRAWINGS

FIGS. 5 (I) to 7 (III) are charts comparing the light uniformity according to the thickness of the first light guide layer and the second light guide layer.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention. In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used.

These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

Figure 1:
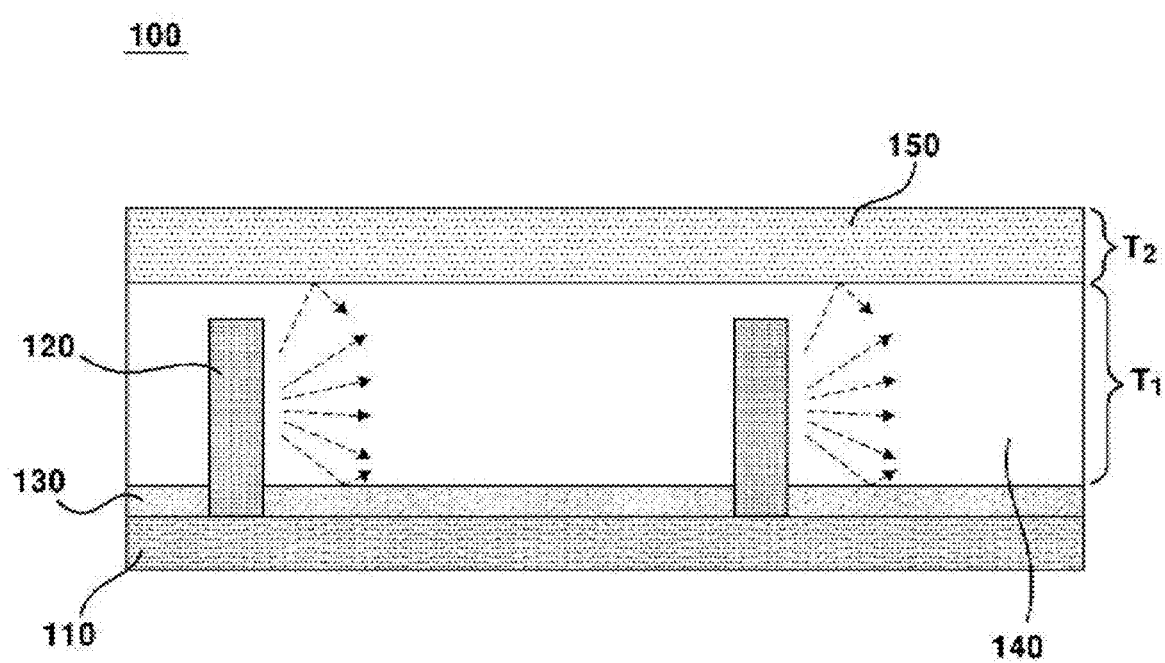
FIG. 1 is a cross-sectional view of a light source module according to an embodiment of the present invention.
Figure 2:
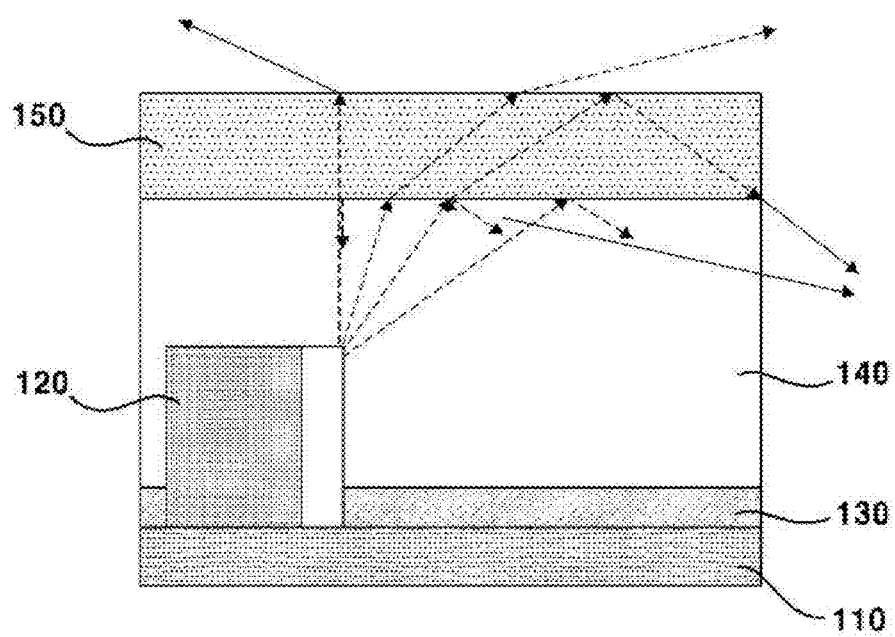
FIG. 2 is an enlarged view in which a part of FIG. 1 is enlarged.

FIG. 1 is a cross-sectional view of a light source module according to an embodiment of the present invention; FIG. 2 is an enlarged view in which a part of FIG. 1 is enlarged; FIG. 3 is a view comparing the irradiation angle of light according to the difference in materials of the first light guide layer and the second light guide layer; FIG. 4 is a view comparing hot spots according to the difference in materials of the first light guide layer and the second light guide layer; and FIGS. 5 to 7 are charts comparing the light uniformity according to the thickness of the first light guide layer and the second light guide layer.

Referring to FIGS. 1 and 2, the light source module 100 according to an embodiment of the present invention may comprise a printed circuit board 110, a light source 120, a light reflection layer 130, a first light guide layer 140, and a second light guide layer 150.

The printed circuit board 110 may be formed in a plate shape, and the light source 120 may be mounted on an upper surface. The light source 120 may include a light emitting diode (LED). The light source 120 may be provided in plurality, and may be disposed on the printed circuit board 110 to be spaced apart from each other. The light source 120 may provide light. The light source 120 may be a side view type light emitting diode. Unlike this, the light source 120 may be a downward direction type light emitting diode.

The light reflection layer 130 may be disposed on an upper surface of the printed circuit board 110. The light reflection layer 130 may be formed in a plate shape and disposed on the printed circuit board 110. The light reflection layer 130 may reflect the light generated from the light source 120 to the area to be irradiated. A hole forming an arrangement area of the light source 120 may be formed in the light reflection layer 130. The light source 120 may be mounted on the printed circuit board 110 through the hole. A plurality of reflective patterns (not shown) may be disposed on the light reflective layer 130. A plurality of reflective patterns (not shown) may further reflect the light generated from the light source 120 to an upper region, and the area of each of the reflective patterns increases as the distance from the light source 120 increases, or, the plurality of reflective patterns may be disposed to include a region in which the density increases. Since the emitted light from the light source 120 becomes weaker as it moves away from the light source 120, in order to realize the uniformity of the light of the light source module 100, the more the emitted light must be reflected upward from the light source 120 as it moves away from the light source 120 and therefore the arrangement of the plurality of reflective patterns (not shown) may proceed as described above.

A first light guide layer 140 and a second light guide layer 150 may be disposed on the printed circuit board 110 and the light reflection layer 130. The first light guide layer 140 and the second light guide layer 150 may be stacked in an up and down direction. The light source may be accommodated in the first light guide layer 140.

The first light guide layer 140 may be formed to have a first thickness T1. The second light guide layer 150 may be formed to have a second thickness T2. The first thickness T1 may be greater than the second thickness T2. The upper surface of the first light guide layer 140 may be disposed higher than the upper surface of the light source 120. The first thickness T1 may be formed to be greater than the height of the light source 120.

Materials of the first light guide layer 140 and the second light guide layer 150 may be different from each other. For example, the material of the first light guide layer 140 may be silicon. The second light guide layer 150 may be made of a material being mixed with barium sulfate and resin. The second light guide layer 150 may be made of a material in which barium sulfate and resin are mixed in a ratio of 1:4. Accordingly, the first light guide layer 140 and the second light guide layer 150 may have different refractive indices. The refractive index of the first light guide layer 140 may be greater than that of the second light guide layer 150.

For example, the refractive index of the first light guide layer 140 may form a range of 1.5 to 1.6. The refractive index of the second light guide layer 150 may form a range of 1.4 to 1.5.

According to the above structure, the light generated from the light source 120 may be guided through the plurality of light guide layers 140 and 150 having different refractive indices. Specifically, since light is diffused through the second light guide layer 150 having a lower refractive index than that of the first light guide layer 140, a more uniform surface light source can be formed.

Figure 3A:
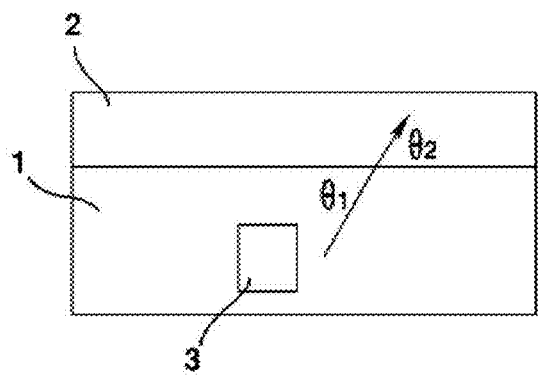
FIGS. 3A and FIG. 3B are views comparing the irradiation angle of light according to the difference in materials of the first light guide layer and the second light guide layer.

When the material of the first light guide layer 140 and the second light guide layer 150 is the same, the light emitted from the light source 3 is respectively transmitted to the first light guide layer 1 and the second light guide layer 2 are irradiated at the same angle with respect to the horizontal plane as shown in FIG. 3(a), so the uniformity of light in the horizontal direction is degraded, and since the light emitted from the light source 3 has straightness without changing the path, there is a problem in that a hotspot occurs in a region close to the light source 3.

Figure 3B:
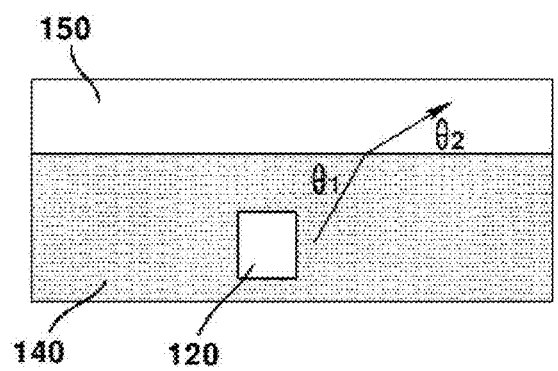

However, as in the present embodiment, when the first optical guide layer 140 and the second optical guide layer 150 are made of different materials, due to the difference in refractive index of each material, as shown in FIG. 3(b), since the light generated from the light source 120 is irradiated at different angles with respect to the horizontal plane at the first light guide layer 140 and the second light guide layer 150, respectively, the uniformity of light in the horizontal direction is improved, and since the change in the path occurs at the time point when the light emitted from the light source 120 enters the second light guide layer 150 from the first light guide layer 140, there is an advantage in that the hot spot in the area close to the light source 120 is reduced.

That is, the light generated from the light source 120 may be irradiated to form a lower angle with respect to the horizontal plane in the second light guide layer 150 than in the first light guide layer 140. Accordingly, the light generated from the light source 120 may be spread more widely in the horizontal direction in the second light guide layer 150, and thus the hot spot may be removed.

Figure 4A:
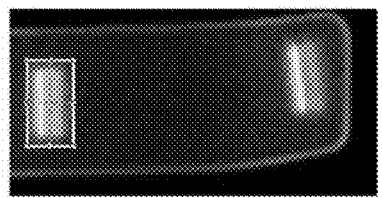
FIGS. 4A and 4B are views comparing hot spots according to the difference in materials of the first light guide layer and the second light guide layer.
Figure 4B:
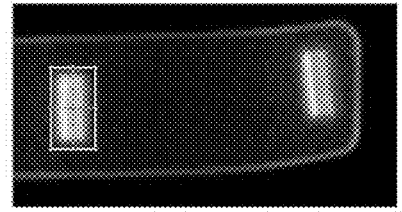

Referring to FIG. 4, a luminance of 89908 cd/m2 is formed in the hot spot generation area when the material of the first light guide layer 140 and the second light guide layer 150 is the same (FIG. 4(a)). However, according to this embodiment (FIG. 4(b)), a luminance of 80326 cd/m2 is formed in the hot spot generation region, and it can be seen that the hot spot generation area is reduced compared to the case where the material of the first light guide layer 140 and the second light guide layer 150 is the same.

FIG. 5 is a chart showing the uniformity of light according to a change in the thickness of the second light guide layer 150 when the first thickness T1 of the first light guide layer 140 is 2 mm.

FIG. 6 is a chart showing the uniformity of light according to a change in the thickness of the first light guide layer 140 when the first thickness T1 of the first light guide layer 140 is 3 mm.

FIG. 7 is a chart showing the uniformity of light according to a change in the thickness of the second light guide layer 150 when the first thickness T1 of the first light guide layer 140 is 4 mm.

Referring to FIGS. 5 to 7, Min [nit] of the vertical axis is the minimum value of the luminance of the light source module 100, Max [nit] is the maximum value of the luminance of the light source module 100, Mean [nit] is the average value of the light source module 100, Homogeneity is the uniformity of the light being emitted by the light source module 100. In addition, 1 in the horizontal axis (box) is the luminance value for the entire area of a straight line crossing the center of the light source module 100, and 2 denotes a luminance value of a partial region of a straight line crossing the center of the light source module 100.

Referring to FIGS. 5 to 7, it can be seen that the uniformity of the light irradiated from the second light guide layer 150 is the highest when the first light guide layer 140 is 3 mm. Accordingly, it can be confirmed that higher light uniformity is formed than in other sections when the thickness of the first light guide layer 140 is 2 mm to 4 mm or less.

FIG. 5 (I) is a chart showing the uniformity of light when the second thickness T2 of the second light guide layer 150 is 0.4 mm.

FIG. 5 (II) is a chart showing the uniformity of light when the second thickness T2 of the second light guide layer 150 is 0.7 mm.

FIG. 5 (III) is a chart showing the uniformity of light when the second thickness T2 of the second light guide layer 150 is 1.0 mm.

Referring to FIGS. 5 (I) to (III), it can be seen that the light uniformity increases as the second thickness T2 of the second light guide layer 150 increases. Accordingly, when the thickness of the first light guide layer 140 is in the range of 2 mm to 4 mm or less and the thickness of the second light guide layer 150 is 0.4 mm to 1.0 mm or less, it can be seen that a higher light uniformity is formed than in other sections.

Referring to FIGS. 5 to 7, when the first thickness T1 of the first light guide layer 140 is 3 mm, even if the second thickness T2 of the second light guide layer 150 is 0.4 mm, according to FIGS. 5 to 7, it can be seen that the uniformity of the light being irradiated from the second light guide layer 150 is higher than when the first thickness T1 of the first light guide layer 140 is 2 mm or 4 mm. Therefore, it is possible to increase the uniformity of light at a low cost when the ratio of the first thickness T1 to the second thickness T2 satisfies the ratio of 3 mm:0.4 mm to 1.0 mm. That is, the second thickness T2 is preferably formed to satisfy a ratio of 0.13 to 0.34 compared to the first thickness T1, it is better to form to satisfy a ratio of 0.23 to 0.34 compared to the first thickness T1, and when forming to satisfy a ratio of 0.33 to 0.34 compared to the first thickness T1, light can be realized most uniformly.

In the above description, it is described that all the components constituting the embodiments of the present invention are combined or operated in one, but the present invention is not necessarily limited to these embodiments. In other words, within the scope of the present invention, all of the components may be selectively operated in combination with one or more. In addition, the terms "comprise", "include" or "having" described above mean that the corresponding component may be inherent unless specifically stated otherwise, and thus it should be construed that it does not exclude other components, but further include other components instead. All terms, including technical and scientific terms, have the same meaning as commonly understood by one of ordinary skill in the art unless otherwise defined. Terms used generally, such as terms defined in a dictionary, should be interpreted to coincide with the contextual meaning of the related art, and shall not be interpreted in an ideal or excessively formal sense unless explicitly defined in the present invention.

The above description is merely illustrative of the technical idea of the present invention, and those skilled in the art to which the present invention pertains may make various modifications and changes without departing from the essential characteristics of the present invention. Therefore, the embodiments disclosed in the present invention are not intended to limit the technical idea of the present invention but to describe the present invention, and the scope of the technical idea of the present invention is not limited by these embodiments. The protection scope of the present invention should be interpreted by the following claims, and all technical ideas within the equivalent scope should be interpreted as being included in the scope of the present invention.

The invention claimed is:

1. A light source module comprising:
a printed circuit board;
a light source disposed on the printed circuit board;

a first light guide layer disposed on the printed circuit board, and accommodating the light source; and
a second light guide layer disposed on an outer surface of the first light guide layer, wherein the material of the first light guide layer is different from the material of the second light guide layer, and
wherein the refractive index of the first light guide layer is greater than the refractive index of the second light guide layer.

2. The light source module according to claim 1,
wherein the material of the first light guide layer includes silicon, and
wherein the material of the second light guide layer includes barium sulfate and resin.

3. The light source module according to claim 2,
wherein the composition ratio of the barium sulfate to the resin is 1:4.

4. The light source module according to claim 1,
wherein the thickness of the first light guide layer is greater than the thickness of the second light guide layer.

5. The light source module according to claim 1,
wherein the light source is a side view type light emitting diode.

6. The light source module according to claim 1, including:
a light reflective layer being disposed on the printed circuit board and reflecting the light irradiated from the light source.

7. The light source module according to claim 1,
wherein the refractive index of the first light guide layer is 1.5 to 1.6 or less, and
wherein the refractive index of the second light guide layer is 1.4 to 1.5 or less.

8. The light source module according to claim 4,
wherein the thickness of the first light guide layer is 2 mm to 4 mm or less, and
wherein the thickness of the second light guide layer is 0.4 mm to 1.0 mm or less.

9. The light source module according to claim 8,
wherein based on the thickness of the first light guide layer, the thickness of the second light guide layer is 0.13 to 0.34 or less.

10. The light source module according to claim 9,
wherein based on the thickness of the first light guide layer, the thickness of the second light guide layer is 0.33 to 0.34 or less.

11. The light source module according to claim 1, wherein the light source is a downward direction type light emitting diode.

12. The light source module according to claim 6, wherein a hole for forming an arrangement area of the light source is formed in the light reflective layer.

13. The light source module according to claim 1, wherein a light generated from the light source is irradiated at different angles from the first light guide layer and the second light guide layer, respectively.

14. The light source module according to claim 13, wherein the light generated from the light source is irradiated at a lower angle in the second light guide layer than in the first light guide layer.

15. The light source module according to claim 6, wherein a plurality of reflective patterns are disposed on the light reflective layer.

16. A light source module comprising:
a printed circuit board;
a light source being disposed on the printed circuit board;
a first light guide layer being disposed on the printed circuit board and accommodating the light source; and
a second light guide layer being disposed on an outer surface of the first light guide layer,
wherein the material of the first light guide layer is different from the material of the second light guide layer, and
wherein the thickness of the first light guide layer is greater than the thickness of the second light guide layer.

17. The light source module according to claim 16,
wherein the material of the first light guide layer includes silicon, and
wherein the material of the second light guide layer includes barium sulfate and resin.

18. The light source module according to claim 17,
wherein the composition ratio of the barium sulfate to the resin is 1:4.

19. The light source module according to claim 16,
wherein the light source is a side view type light emitting diode.

20. The light source module according to claim 16, including:
a light reflective layer being disposed on the printed circuit board and reflecting the light irradiated from the light source.

* * * * *